(12) United States Patent
Yamano

(10) Patent No.: US 7,370,411 B2
(45) Date of Patent: May 13, 2008

(54) WIRING BOARD MANUFACTURING METHOD

(75) Inventor: Takaharu Yamano, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 21 days.

(21) Appl. No.: 11/373,610

(22) Filed: Mar. 10, 2006

(65) Prior Publication Data

US 2006/0207088 A1    Sep. 21, 2006

(30) Foreign Application Priority Data

Mar. 15, 2005    (JP)    ............... 2005-073945

(51) Int. Cl.
*H05K 3/30*    (2006.01)
(52) U.S. Cl. ............... 29/832; 29/830; 29/840; 29/852
(58) Field of Classification Search ............ 29/825, 29/830, 832, 840, 852
See application file for complete search history.

(56) References Cited

U.S. PATENT DOCUMENTS

| 4,737,395 | A | * | 4/1988 | Mabuchi et al. | ............ | 428/138 |
| 4,773,955 | A | * | 9/1988 | Mabuchi et al. | ............ | 156/257 |
| 6,100,594 | A | * | 8/2000 | Fukui et al. | ............ | 257/777 |
| 6,121,553 | A | * | 9/2000 | Shinada et al. | ............ | 174/259 |
| 6,853,087 | B2 | * | 2/2005 | Neuhaus et al. | ............ | 257/778 |
| 2006/0208356 | A1 | | 9/2006 | Yamano et al. | | |

FOREIGN PATENT DOCUMENTS

JP    2001-217381    8/2001

OTHER PUBLICATIONS

U.S. Appl. No. 11/372,916, Wiring Board and Method of Manufacturing the Same, Takaharu Yamano et al., filed Mar. 10, 2006.

* cited by examiner

*Primary Examiner*—Carl J. Arbes
(74) *Attorney, Agent, or Firm*—Rankin, Hill & Clark LLP

(57) ABSTRACT

A method of manufacturing a wiring board includes: forming a first insulating layer on a supporting board; mounting at least one reinforcing member on the first insulating layer; mounting at least one semiconductor chip on the first insulating layer; forming a second insulating layer on the reinforcing member and the semiconductor chip; and forming a wiring on the second insulating layer, the wiring being connected to the semiconductor chip.

12 Claims, 12 Drawing Sheets

WIRING BOARD MANUFACTURING METHOD

This application claims foreign priority based on Japanese Patent application No. 2005-073945, filed Mar. 15, 2005, the content of which is incorporated herein by reference in its entirety.

BACKGROUND OF THE INVENTION

1. Field of the Invention

The present invention relates to a method of manufacturing a wiring board, and more particularly, to a method of manufacturing a wiring board incorporating a semiconductor chip.

2. Description of the Related Art

Currently, enhancement in performance of electronic devices using semiconductor devices such as semiconductor chips has been advanced. Higher-density of semiconductor chips mounted on a board, reduction in size of the board on which the semiconductor chips are mounted, and saving of space in the board are demanded.

Thus, a board in which a semiconductor chip is embedded, that is, a built-in chip type wiring board has been proposed. Various configurations for incorporating the semiconductor chip in the board have been proposed (for example, refer to JP-A-2001-217381). Such a built-in chip type wiring board has a wiring structure connected to a semiconductor chip. Also, a terminal connection portion is formed on the wiring board so that the wiring board can be connected to another device, a motherboard, or the like.

However, in a case where reduction in thickness (thin) and higher-density in the built-in chip type wiring board are realized, warpage of the wiring board may be a problem. In order to deal with such warpage of the wiring board, it is necessary to laminate a board having a predetermined thickness such as a core board, with a layer in which a semiconductor chip is embedded, so that the wiring board has a structure suppressing the warpage. Consequently, in the built-in chip type wiring board with such a laminated structure, it is difficult to realize the reduction in the thickness of the wiring board and the higher-density in the wiring board.

Also, it is difficult to achieve the reduction in the thickness of the wiring board while suppressing the warpage of the wiring board.

SUMMARY OF THE INVENTION

An object of the present invention is to provide a novel and a useful wiring board and a method of manufacturing the wiring board, thereby solving the aforementioned problems.

In the present invention, reduction in thickness of a wiring board incorporating semiconductor chips is achieved, and warpage of such a wiring board is suppressed.

In some implementations, a method of manufacturing a wiring board of the invention comprises: forming a first insulating layer on a supporting board; mounting at least one reinforcing member on the first insulating layer; mounting at least one semiconductor chip on the first insulating layer; forming a second insulating layer on the reinforcing member and the semiconductor chip; and forming a wiring on the second insulating layer, the wiring being connected to the semiconductor chip.

This method of manufacturing the wiring board according to the invention enables the reduction in the thickness of the wiring board incorporating semiconductor chips, and the suppression of the warpage of such a wiring board.

The method of manufacturing the wiring board of the invention further comprises: peeling the supporting board from the first insulating layer. Thus, the warpage of the wiring board is suppressed in the process of manufacturing the wiring board. Also, the thickness of the wiring board can be reduced. Consequently, this method is favorable.

The method of manufacturing the wiring board of the invention further comprises: forming a release layer between the supporting board and the first insulating layer, the release layer facilitating peeling of the supporting board from the first insulating layer. This facilitates the peeling-off of the supporting board. Thus, this embodiment is favorable.

The method of manufacturing the wiring board of the invention further comprises: curing the first insulating layer and the second insulating layer by heat, wherein the first insulating layer and the second insulating layer are made of heat-hardening resin material. This enables that the first insulating layer and the second insulating layer are integrally heat-cured. The step of curing by heat can be simplified. Consequently, this embodiment is favorable.

In the method of manufacturing the wiring board of the invention, the reinforcing member and the semiconductor chip are mounted on substantially a same plane. Thus, the warpage of the wiring board can be suppressed by the reinforcing member. Simultaneously, the wiring board can be suppressed from becoming thicker than the wiring board manufactured by the related method. Consequently, this embodiment is favorable.

In the method of manufacturing the wiring board of the invention, the reinforcing member is formed so as to surround the semiconductor chip. Thus, the effect of suppressing the warpage of the wiring board can favorably be obtained. Consequently, this embodiment is favorable.

The method of manufacturing the wiring board of the invention further comprises: forming a via hole in the second insulating layer; and forming a via plug in the via hole. In the method of manufacturing the wiring board of the invention, the via plug is formed in the via hole in a same step as forming the wiring on the second insulating layer. Thus, the favorable reliability of connection between the wiring and the semiconductor chip can be obtained.

In the method of manufacturing the wiring board of the invention, the via hole is formed by using a laser beam, and a bump formed on the semiconductor chip serves as a stopper layer of the laser beam. Thus, the via hole can accurately and easily be formed. Consequently, this embodiment is favorable.

The method of manufacturing the wiring board of the invention further comprises: grinding the second insulating layer so as to expose a bump formed on the semiconductor chip, wherein the wiring is formed on the second insulating layer so as to be connected to the exposed bump.

In the method of manufacturing the wiring board according to the invention, reliability of connection between the wiring and the semiconductor chip becomes favorable.

According to the invention, the reduction in the thickness of the wiring board incorporating semiconductor chips is achieved, and the suppression of the warpage of such a wiring board is possible.

DESCRIPTION OF THE PREFERRED EMBODIMENTS

Next, embodiments of the invention are described below with reference to the accompanying drawings.

First Embodiment

Figure 1:
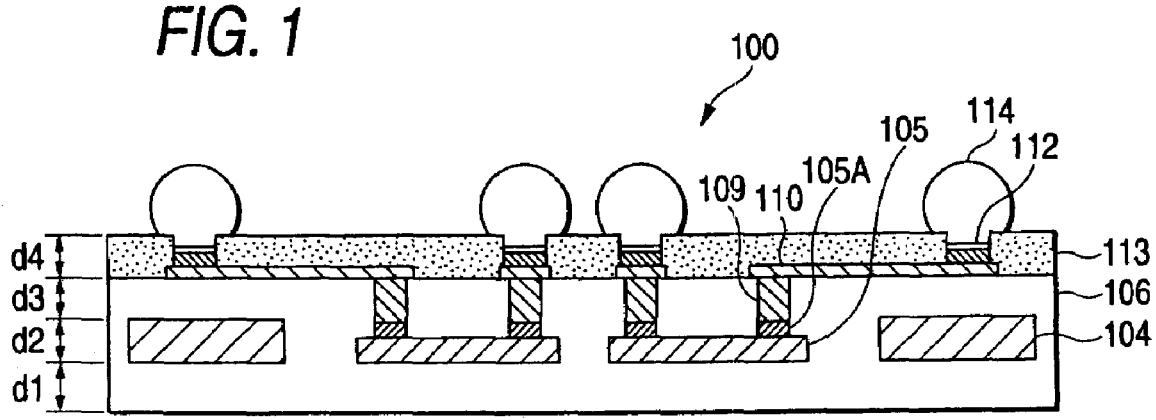
FIG. 1 is a cross-sectional view schematically illustrating a wiring board according to a first embodiment of the invention.

FIG. 1 is a cross-sectional view schematically showing a wiring board according to a first embodiment of the invention. Referring to FIG. 1, a wiring board 100 shown in this figure has an insulating layer 106 made of, for example, an epoxy resin or a polyimide resin. The wiring board 100 has a structure in which at least one semiconductor chip 105 is embedded in the insulating layer 106.

A bump 105A made of, for instance, NiP (nickel-phosphorus) is formed on an electrode pad (not shown) of the semiconductor chip 105. A via plug 109 made of, for instance, Cu is formed on the bump 105A so as to be erected thereon. Also, a pattern wiring 110 made of, for example, Cu is formed on the insulating layer 106 integrally with the via plug 109 so as to be connected to the via plug 109.

Also, a terminal connection portion 112 including, for example, a Ni/Au layer is formed on the pattern wiring 110. A solder resist layer 113 is formed on the pattern wiring 110 and the insulating layer 106 so as to surround the terminal connection portion 112.

Further, a solder bump 114 is formed on the terminal connection portion 112, as required. In the configuration shown in this figure, the solder bump 114 and the solder resist layer 113 may be omitted.

Hitherto, in the case of reducing the thickness of such a built-in semiconductor chip type wiring board, the wiring board and a structural body such as a core board which supports the wiring board and suppresses the warpage of the wiring board are sometimes laminated. Therefore, it is difficult to achieve both of the reduction in the thickness of the wiring board and the suppression of the warpage thereof.

Thus, the wiring board 100 according to this embodiment is configured so that a reinforcing member 104 preventing the warpage by reinforcing the insulating layer 106 is embedded in the insulating layer 106 in which the semiconductor chip 105 is embedded. The warpage of the wiring board 100 can be suppressed by using the reinforcing member 104. In the case of the aforementioned structure, the warpage of the wiring board 100 can effectively be suppressed without practically increasing the thickness of the wiring board 100.

Thus, this embodiment has a structure enabled to reduce the thickness of the wiring board, as compared with the wiring board having a structure in which the insulating layer 106 and the core board for supporting the insulating layer 106 are laminated.

In a case of what is called a face-up type wiring board such as the wiring board 100, the via plug connected to the semiconductor chip, and the pattern wiring are formed after the semiconductor chip is embedded in the insulating layer. Thus, for the following reasons, it is sometimes difficult to maintain the reliability of connection of the wiring.

For example, the insulating layer 106 is made of a heat-hardening resin material. Thus, after the semiconductor chip is embedded in the insulating layer, the via plug which is connected to this semiconductor chip, and the wiring pattern are formed through a heat curing process. In this case, when the heat-curing of the insulating layer 106 causes warpage thereof, it is difficult to connect the via plug to the semiconductor chip. Consequently, the reliability of the connection is sometimes deteriorated.

Thus, the wiring board according to this embodiment is enabled to suppress the warpage due to the heat curing, and to have high-reliability of the connection. Accuracy required to mount (provide) the semiconductor chip on such a face-up type wiring board is not high, as compared with a face-down type (a flip-chip type) wiring board. Thus, the wiring board according to this embodiment has an advantage in that the semiconductor chip can easily be mounted thereon.

For example, in the face-down type wiring board high accuracy of alignment is needed on an alignment between the formed pattern wiring or the like and connection portion of the semiconductor chip. Thus, sometimes, it takes cost and time to mount the semiconductor chip on the face-down type wiring board.

In the case of the wiring board according to this embodiment, as will be described later, it is advisable to mount the semiconductor chip on the insulating layer. Thus, the alignment can easily be achieved when the semiconductor chip is mounted. Also, the warpage of the insulating layer at the heat-curing process is suppressed by the reinforcing member 104. Thus, the wiring board according to this embodiment has an advantage that the alignment between the via plug and the wiring after the mounting of the semiconductor chip is facilitated.

Various materials can be used for the reinforcing member 104. For example, resin materials harder than the insulating layer 106, which are, for instance, organic core materials (sometimes referred to as pre-preg materials) used in the core board or the like, metallic materials such as Cu, Ni, Fe, alloy materials of these metallic materials, or composite materials may be used.

Preferably, the reinforcing member 104 is formed on substantially the same plane as a plane on which the semiconductor chip 105 is formed. Thus, the reinforcing member 104 is embedded in the insulating layer 106 without increasing the thickness of the insulating layer 106.

The wiring board 100 according to this embodiment can be formed in various shapes and thicknesses according to a specification of the semiconductor chip and a specification for connection. An example of the practical thickness of the wiring board is described below.

For instance, a distance d1 from a bottom surface (lower end surface) of the insulating layer 106 to a lower end surface of the reinforcing member 104 is 50 µm. A thickness d2 of the reinforcing member 104 is 100 µm. A distance d3 from a top surface of the reinforcing member 104 to a lower end surface of the solder resist layer 113 is equal to or less than 20 µm. A thickness of the solder resist layer 113 is 30 µm.

In this case, the thickness of the wiring board (excluding the solder bump 114) is equal to or less than 200 µm.

Figure 2A:
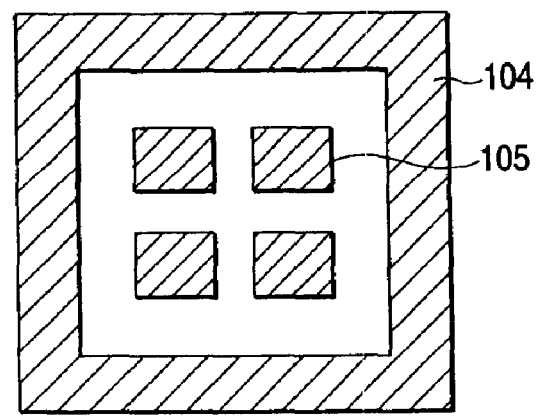
FIG. 2A is a first view illustrating a method of providing a reinforcing member according to a first embodiment.

FIG. 2A schematically shows a plan view of the wiring board 100 shown in FIG. 1. Incidentally, in FIG. 2A, the drawing of components other than the semiconductor chip 105 and the reinforcing member 104 is omitted. As shown in FIG. 2A, the reinforcing member 104 is formed around the semiconductor chip 105 so as to surround the semiconductor chip 105, for example. Thus, the advantage in preventing the warpage is favorably enhanced. Incidentally, a single semiconductor chip or a plurality of the semiconductor chips may be mounted thereon. In this case, the reinforcing member 104 is formed so as to surround the plurality of semiconductor chips.

The reinforcing member is not limited to the aforementioned example. For instance, the shape of the reinforcing member can be changed in various manners as described below.

Figure 2B:
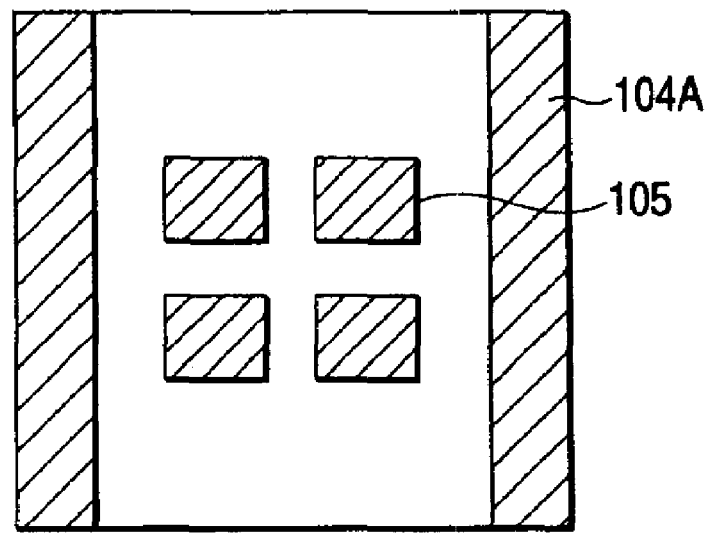
FIG. 2B is a second view illustrating a method of providing the reinforcing member according to a first embodiment.
Figure 2C:
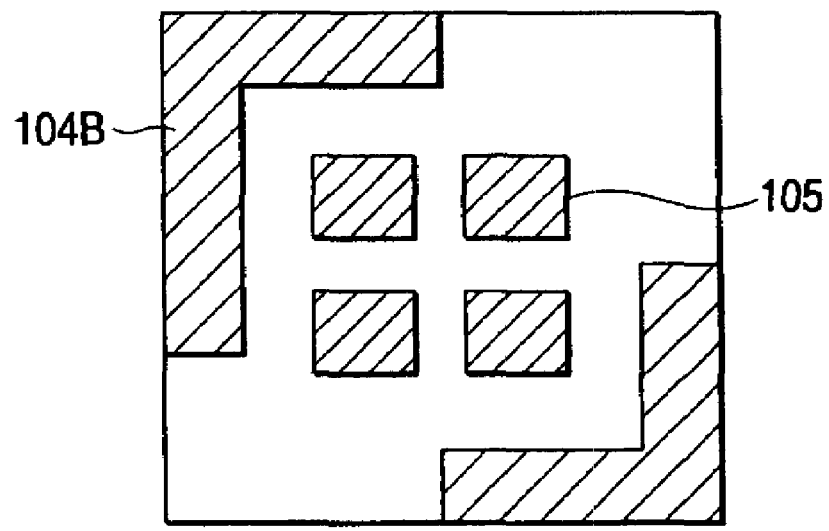
FIG. 2C is a third view illustrating a method of providing the reinforcing member according to a first embodiment.

FIGS. 2B and 2C are views showing modifications of the reinforcing member shown in FIG. 2A. Incidentally, the aforementioned components shown in FIG. 2A are designated in FIGS. 2B and 2C by the same reference numerals as those used in FIG. 2A. Thus, the description of such components is omitted. The reinforcing member may be modified like reinforcing members 104A shown in FIG. 2B, which are placed on both sides (end portions) of the wiring board, respectively, and are opposed to each other. Alternatively, the reinforcing member may be modified like reinforcing members 104B shown in FIG. 2C, which are placed in vicinities of corner portions of the wiring board, respectively, and are opposed to each other. As stated above, various modifications and alterations of the reinforcing member may be made according to a size of the semiconductor chip, a wiring structure, or specification of the wiring board.

Next, an example of a method of manufacturing the wiring board 100 shown in FIG. 1 according to this embodiment of the invention is described below sequentially in order of steps with reference to FIGS. 3A to 3N.

Figure 3A:
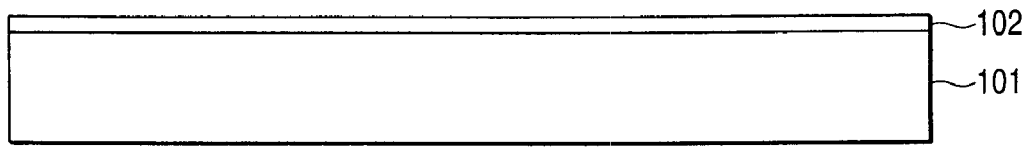
FIG. 3A is a first view illustrating a method of manufacturing the wiring board according to a first embodiment.
Figure 3B:
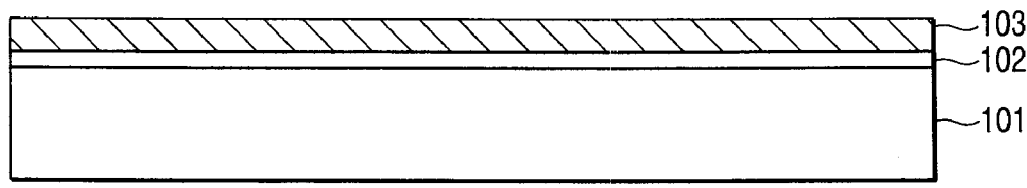
FIG. 3B is a second view illustrating a method of manufacturing the wiring board according to a first embodiment.

First, in a step shown in FIG. 3A, an adhesive release tape is applied onto a supporting board 101 made of, for example, a Si-wafer having a thickness of 725 µm. Thus, a release layer 102 is formed. In this case, for example, an organic material such as the organic core material maybe used for the supporting board 101.

Subsequently, an insulating layer 103 made of the heat-hardening resin material such as the epoxy resin or the polyimide resin is formed on the supporting board 101 by laminating or application. In this case, the insulating layer 103 may be formed on the supporting board 101 so as to be in contact with the supporting board 101. Preferably, the insulating layer 103 is formed on the supporting board 101 through the release layer 102 formed in the step shown in FIG. 3A to thereby facilitate a peeling of the supporting board 101.

Subsequently, in a step illustrated in FIG. 3C, the reinforcing member 104 made of, for instance, Cu is provided (mounted) on the insulating layer 103. In this case, a lead frame may be used as the reinforcing member 104. Alternatively, the reinforcing member 104 can be formed by performing Cu plating.

Subsequently, in a step illustrated in FIG. 3D, the semiconductor chip 105 is provided (mounted) on the insulating layer 103, for example in a region which is surrounded by the reinforcing member 104. In this case, preferably, the bumps 105A made of, for example, NiP (nickel-phosphorus), are formed on the electrode pads (not shown) of each of the semiconductor chips 105. The bumps 105A serve as stopper layers when via holes are formed in the insulating layer, as will be described later. Also, the bumps 105A enhance the reliability of the electrical connection between the via plug which is formed in each of the via holes, and the semiconductor chip. A plurality of semiconductor chips may be mounted therein. Additionally, for example, the semiconductor chips 105, the thickness of each of which is about 95 µm, and the bumps 105A, the thickness of each of which is about 5 µm, can be used.

Subsequently, in a step illustrated in FIG. 3E, the insulating layer 106 made of a heat-curable epoxy resin or a heat-curable polyimide resin, the thickness of which is about 100 μm, for example, is formed by laminating, for example, so as to cover the semiconductor chips 105 and the reinforcing member 104. Thus, the semiconductor chips 105 and the reinforcing member 104 are embedded in the insulating layer 106.

Subsequently, in a step illustrated in FIG. 3F, flattening press of the insulating layers 103 and 106 is performed. Also, a heating process (referred to as curing) is performed so as to heat the insulating layers 103 and 106 at, for example, 160° C. Thus, heat-curing process is performed thereon. At that time, the insulating layers 103 and 106 become integrally formed with each other completely. Therefore, in this and subsequent figures, a structure in which the insulating layers 103 and 106 are combined is designated as the insulating layer 106.

In this case, the reinforcing member 104 is embedded in the insulating layer 106. The warpage of the insulating layer especially due to the heat curing process can effectively be suppressed.

Since the heat-curing process is performed simultaneously on the insulating layers 103 and 106, the process of heating the insulating layer 103 is closely related to that of heating the insulating layer 106. Thus, the warpage of each of the insulating layers, which is caused by heat, can be much more suppressed.

Subsequently, in a step shown in FIG. 3G, via holes BH reaching the bumps 105A are formed in the insulating layer 106 by using, for example, laser beams. In this case, the bumps 105A formed on the electrode pads of the semiconductor chip 105 serve as the stopper layers against the laser beams. Thus, the electrode pads are prevented from being damaged. Also, preferably, after the via holes are formed, desmear process by using chemical is performed as needed, which is a residual treatment and roughening process of the surface of the insulating layer.

Subsequently, in a step shown in FIG. 3H, a seed layer 107 is formed on the insulating layer 106 including inner wall surfaces of the via holes BH, and the bumps 105A, by electroless Cu plating, for example.

Subsequently, in a step shown in FIG. 3I, for example, a dry film resist (DFR) is laminated on the seed layer 107. Then, patterning is performed thereon by performing a photolithography process. Thus, a resist pattern 108 is formed.

Subsequently, in a step shown in FIG. 3J, the via plug 109 and a pattern wiring 110 are integrally formed by, for instance, electrolytic Cu plating, so that the via plug 109 buries each via hole BH and the pattern wiring 110 buries each opening portion of the resist pattern 108. Upon completion of the electrolytic plating, the resist pattern 108 is peeled off.

Subsequently, in a step shown in FIG. 3K, for example, the dry resist film is laminated on the seed layer 107 and on the pattern wiring 110. Then, the patterning is performed thereon by the photolithography method. Thus, a resist pattern 111 is formed.

Subsequently, in a step shown in FIG. 3L, the terminal connection portions 112, each of which includes, for instance, the Ni/Au layer, are formed by, for example, the electrolytic plating on a surface of opening portions of the resist pattern 111 from which the pattern wiring 110 is exposed. Then, the resist pattern 111 is peeled off after the terminal connection portions 112 are formed. Further, unnecessary portions of the seed layer 107 on the insulating layer 106 are removed by etching.

Subsequently, in a step shown in FIG. 3M, a solder resist layer 113 is formed on the pattern wiring 110 and the insulating layer 106 so as to expose the terminal connection portions 112.

Subsequently, in a step shown in FIG. 3N, the entire wiring board is heated to 180° C. by, for instance, an oven. Then, the insulating layer 106 is peeled off from the release layer 102, and the supporting board 101 is removed from the insulating layer 106. In this case, preferably, adhesive strength of the release layer 102 lowers by being heated. After this step, solder balls are formed on the terminal connection portions 112, as needed. Thus, the wiring board 100 shown in FIG. 1 can be formed.

In this embodiment, the wiring board 100 having the release layer 102 is used, so that insulating layer 106 is peeled off from the release layer 102 and the supporting board 101 is removed from the insulating layer 106 by applying heat. However, the wiring board 100 may be made of metal such as Cu, without the release layer. In this case, in the step of removing the supporting board 101 from the insulating layer 106, the supporting board 101 made of, for example, Cu may be removed by etching. Moreover, when the supporting board 101 is made of an electrically conductive material, the supporting board may be used as an electrode used at the electrolytic plating.

Figure 3C:
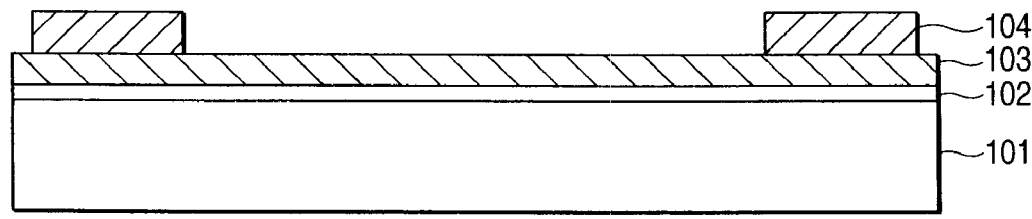
FIG. 3C is a third view illustrating a method of manufacturing the wiring board according to a first embodiment.
Figure 3D:
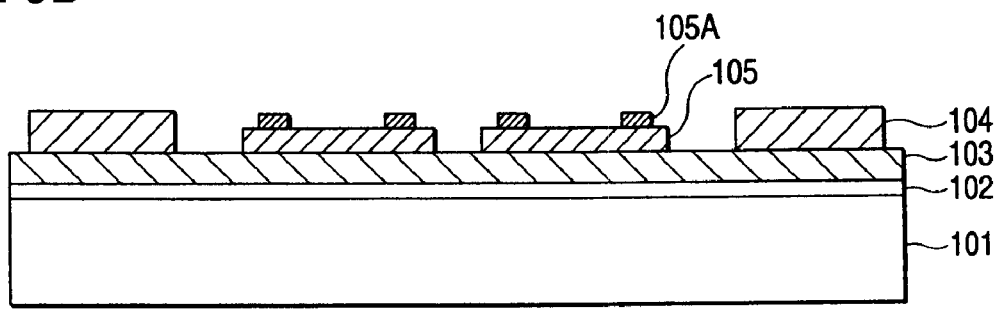
FIG. 3D is a fourth view illustrating a method of manufacturing the wiring board according to a first embodiment.
Figure 3E:
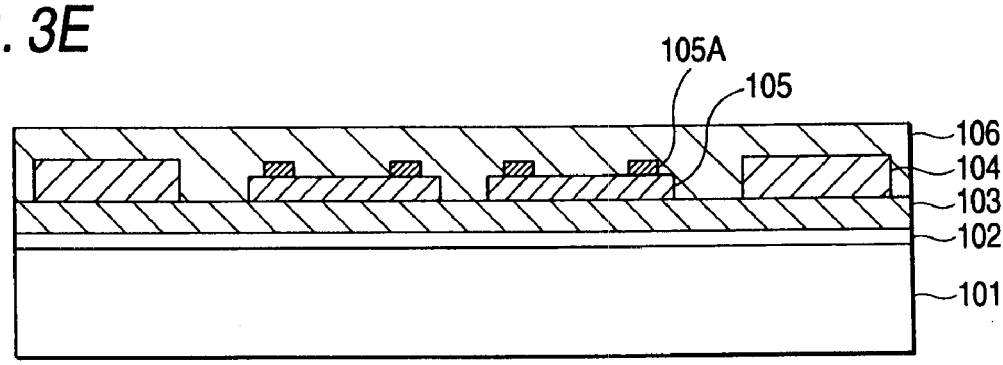
FIG. 3E is a fifth view illustrating a method of manufacturing the wiring board according to a first embodiment.
Figure 3F:
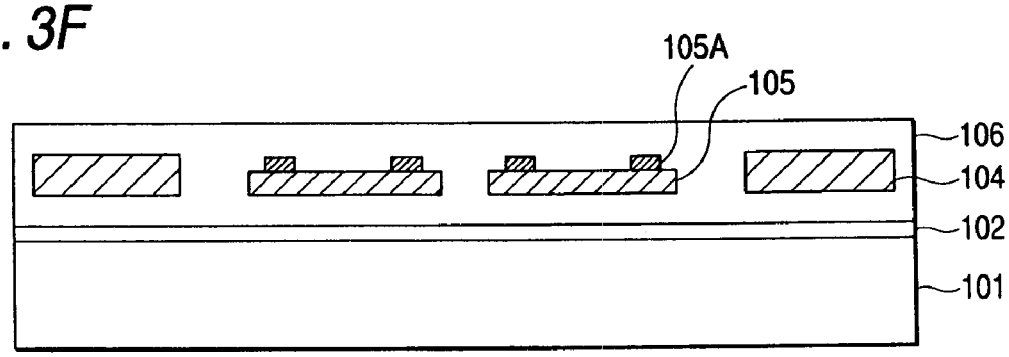
FIG. 3F is a sixth view illustrating a method of manufacturing the wiring board according to a first embodiment.
Figure 3G:
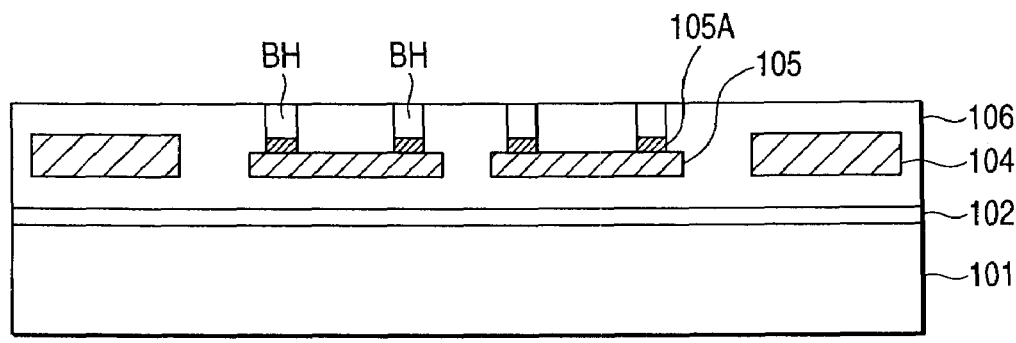
FIG. 3G is a seventh view illustrating a method of manufacturing the wiring board according to a first embodiment.
Figure 3H:
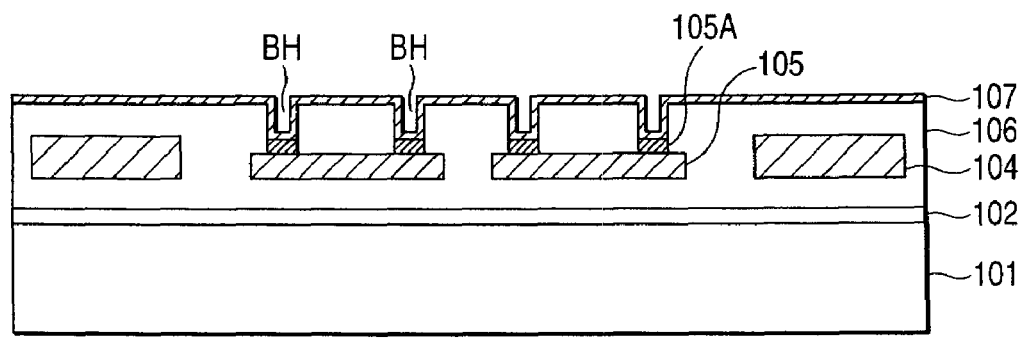
FIG. 3H is an eighth view illustrating a method of manufacturing the wiring board according to a first embodiment.
Figure 3I:
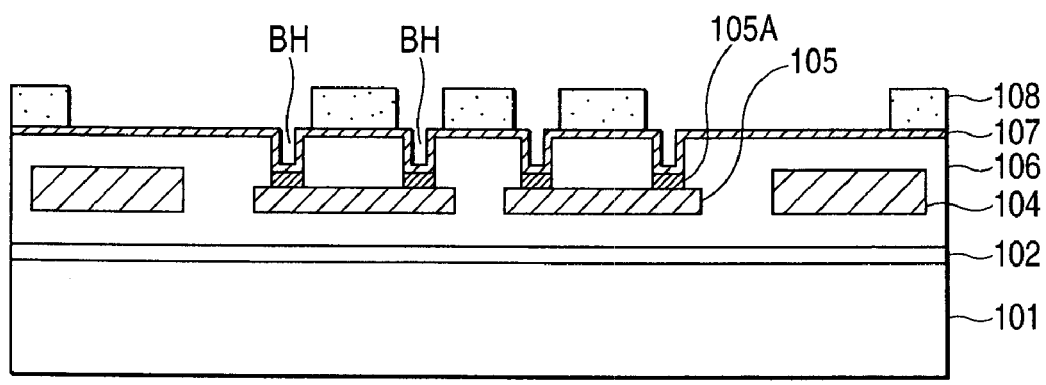
FIG. 3I is a ninth view illustrating a method of manufacturing the wiring board according to a first embodiment.
Figure 3J:
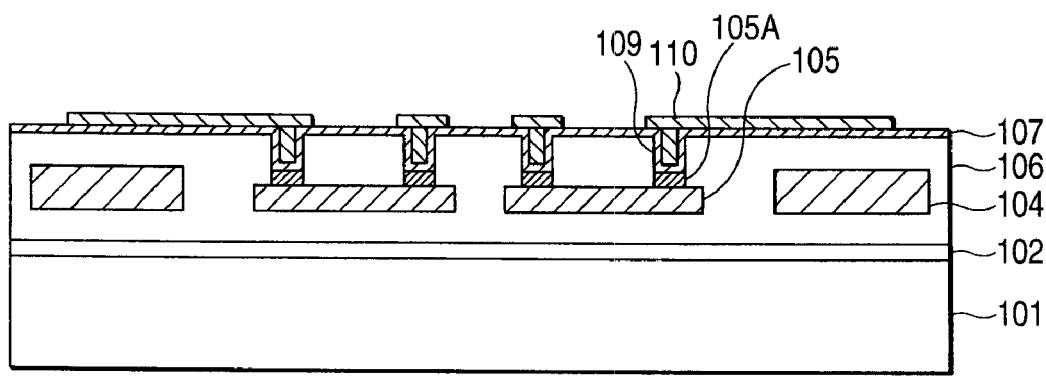
FIG. 3J is a tenth view illustrating a method of manufacturing the wiring board according to a first embodiment.
Figure 3K:
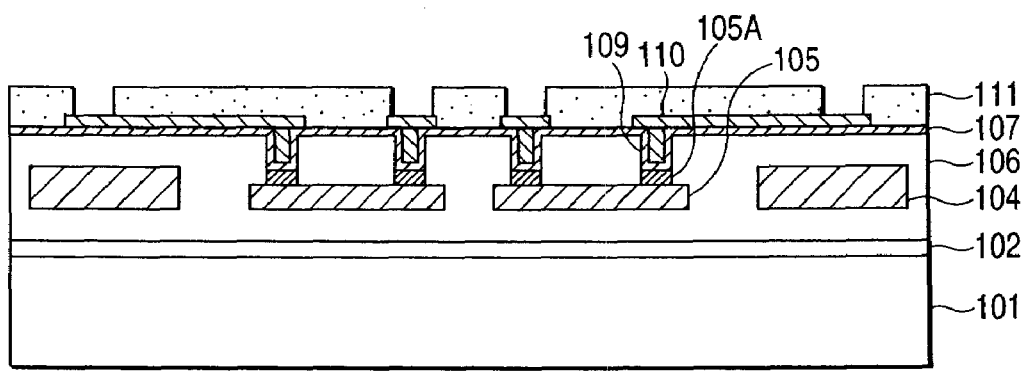
FIG. 3K is an eleventh view illustrating a method of manufacturing the wiring board according to a first embodiment.
Figure 3L:
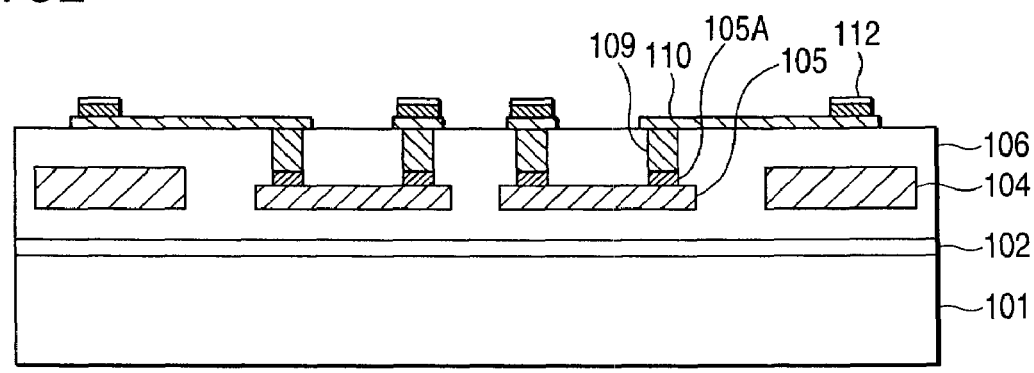
FIG. 3L is a twelfth view illustrating a method of manufacturing the wiring board according to a first embodiment.
Figure 3M:
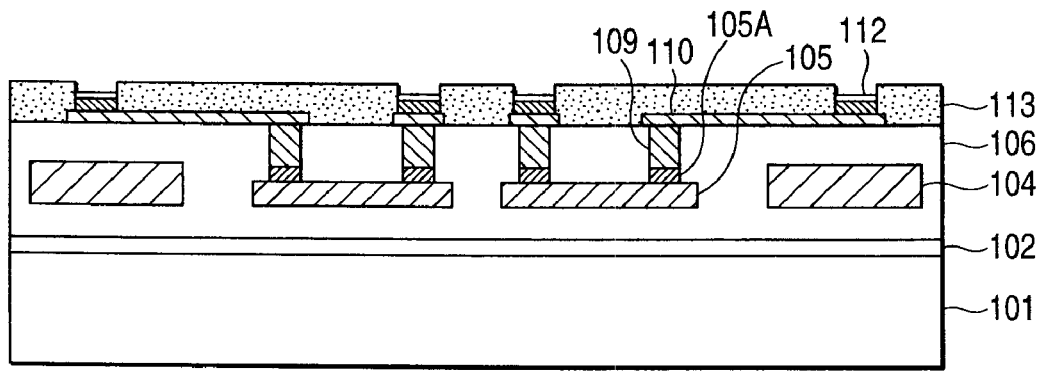
FIG. 3M is a thirteenth view illustrating a method of manufacturing the wiring board according to a first embodiment.
Figure 3N:
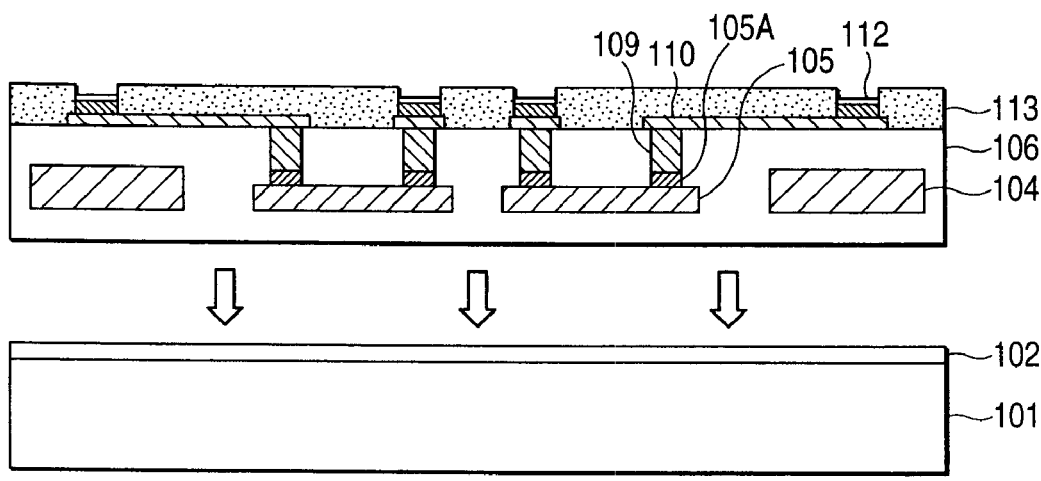
FIG. 3N is a fourteenth view illustrating a method of manufacturing the wiring board according to a first embodiment.

In accordance with the manufacturing method according to this embodiment, the reinforcing member 104 is provided in the step shown in FIG. 3C. Then, the curing is performed on the insulating layer 106 in which the reinforcing member 104 is embedded in the step shown in FIG. 3F.

Thus, in the subsequent steps, an advantage in suppressing a degree of the warpage of the insulating layer 106 or a degree of the warpage of the entire wiring board is obtained. Especially, the degree of the warpage due to change in stress, which is caused by rise/fall of temperature, and to change in stress, which is caused by the plating, the desmear process, the laminating process, and the like is more effectively suppressed, as compared with the related method. Consequently, a wiring board can be formed of which degree in flatness is high and which has high reliability.

Additionally, in this embodiment, the wiring board 100 is formed on, for example, the supporting board 101 in the predetermined manufacturing process. Thus, the degree of the warpage is suppressed in the manufacturing process. Also, the supporting board 101 is removed upon completion of performing the predetermined manufacturing process. Thus, the reduction in the thickness of the wiring board can be achieved.

Second Embodiment

The wiring board according to the invention is not limited to that according to the first embodiment. Various modifications and alterations of, for example, the wiring structure or the reinforcing member may be made.

Figure 4:
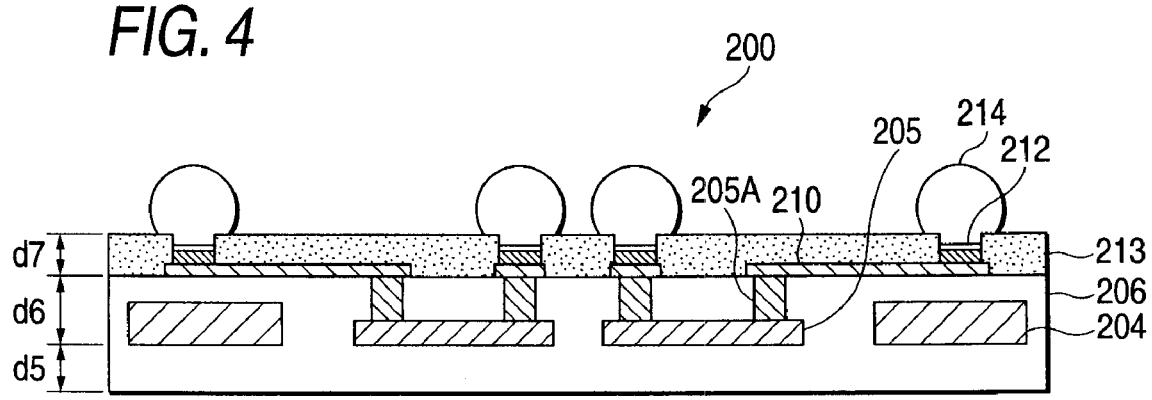
FIG. 4 is a cross-sectional view schematically illustrating a wiring board according to a second embodiment of the invention.

For example, FIG. 4 shows a wiring board 200 according to a second embodiment of the invention.

Referring to FIG. 4, in the wiring board 200 shown in this figure, an insulating layer 206, a reinforcing member 204, a semiconductor chip 205, a pattern wiring 210, a terminal connection portion 212, a solder resist layer 213, and a solder ball 214 respectively correspond to the insulating layer 106, the reinforcing member 104, the semiconductor chip 105, the pattern wiring 110, the terminal connection portion 112, the solder resist layer 113, and the solder ball 114 shown in the wiring board 100 shown in FIG. 1. These structures of the wiring board 200 are similar to those of the wiring board 100.

In the wiring board 200 according to this embodiment, a bump 205A made of, for instance, Cu is formed on an electrode pad (not shown) of the semiconductor chip 205. This bump 205A corresponds to the via plug 109 and the bump 105A in the wiring board 100. That is, in this embodiment, the bump 205A is formed so that a thickness (height) of the bump 205A is, for example, 15 µm and is thicker (higher) than that of the bump 105A. Thus, the bump 205A also serves as the via plug, and electrically connects the semiconductor chip to the pattern wiring.

Thus, as described below, in the case of manufacturing the wiring board according to this embodiment, the step of forming the via hole, and the desmear processing accompanied therewith are unnecessary. Consequently, this embodiment has advantages that the manufacturing process is simplified, and that the manufacturing cost is reduced.

Next, an example of a method of manufacturing the wiring board 200 shown in FIG. 4 according to this embodiment is described below sequentially in the order of steps with reference to FIGS. 5A to 5K.

Figure 5A:
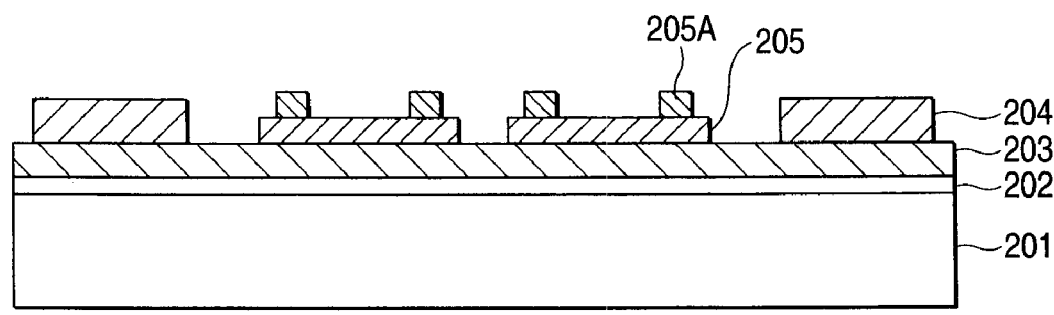
FIG. 5A is a first view illustrating a method of manufacturing the wiring board according to a second embodiment.

In this embodiment, first, the steps shown in FIGS. 3A to 3D, which are performed in the first embodiment, are performed to obtain a state shown in FIG. 5A. Incidentally, in this case, a supporting board 201, a release layer 202, an insulating layer 203, the reinforcing member 204, and the semiconductor chip 205 respectively correspond to the supporting board 101, the release layer 102, the insulating layer 103, the reinforcing member 104, and the semiconductor chip 105 of the first embodiment, and can be formed similarly to the case of the first embodiment.

In the case of the second embodiment, the bump 205A provided on the semiconductor chip 205 is made of, for example, Cu, and is formed so that the bump 205A is thick as compared with the bump 105A of the first embodiment (the height of the bump 205A is larger than that of the bump 105A). In this case, for instance, the height of the bump 205A is about 15 µm.

Figure 5B:
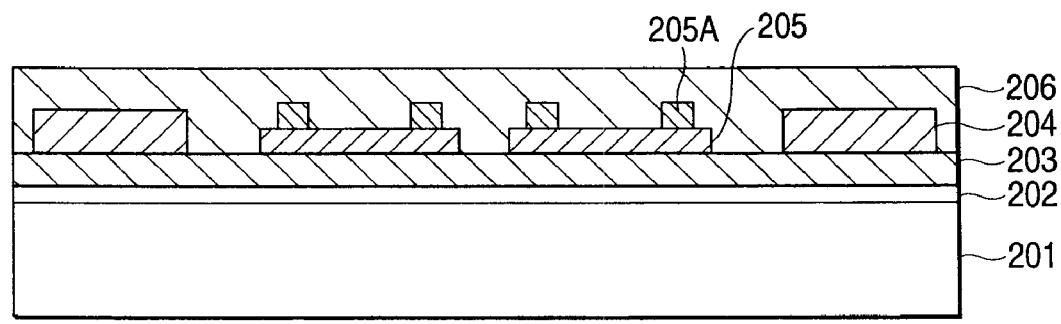
FIG. 5B is a second view illustrating a method of manufacturing the wiring board according to a second embodiment.
Figure 5C:
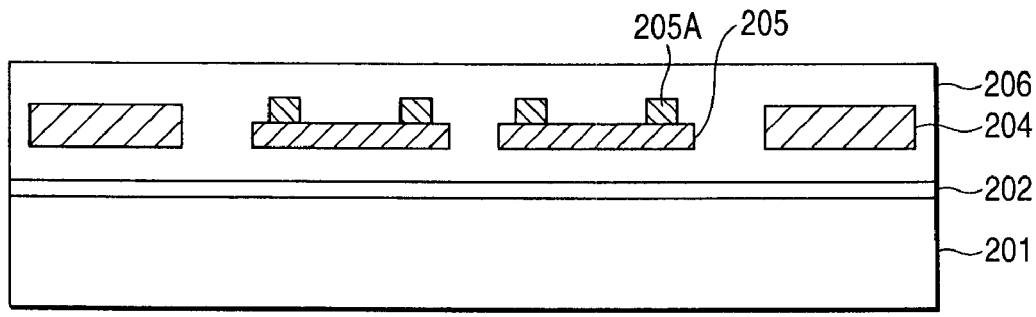
FIG. 5C is a third view illustrating a method of manufacturing the wiring board according to a second embodiment.

Subsequently, the insulating layer 206 is formed in steps shown in FIGS. 5B to 5C. Steps of performing flattening press and heating process can be performed similarly to the steps shown in FIGS. 3E and 3F, which are performed in the first embodiment.

Figure 5D:
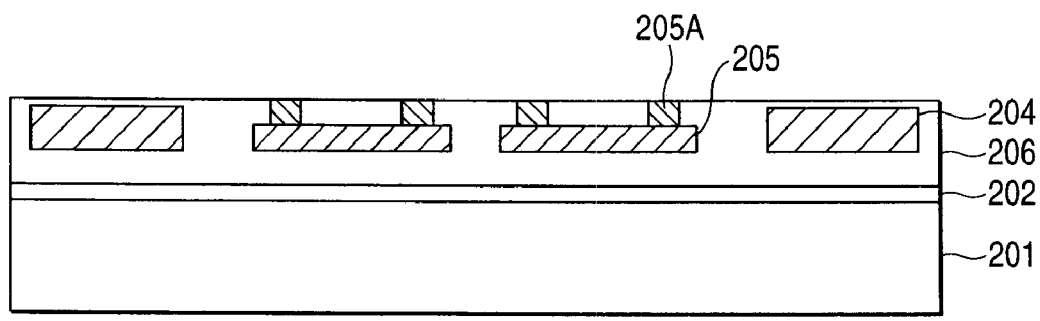
FIG. 5D is a fourth view illustrating a method of manufacturing the wiring board according to a second embodiment.

Subsequently, in a step shown in FIG. 5D, the heat-cured insulating layer 206 is grinded by, for example, buffing, so that the bump 205A is exposed. In this case, a method of grinding the insulating layer 206 is not limited to the buffing. For instance, the grinding may be performed by another method, for example, a CMP (Chemical Mechanical Polishing).

Figure 5E:
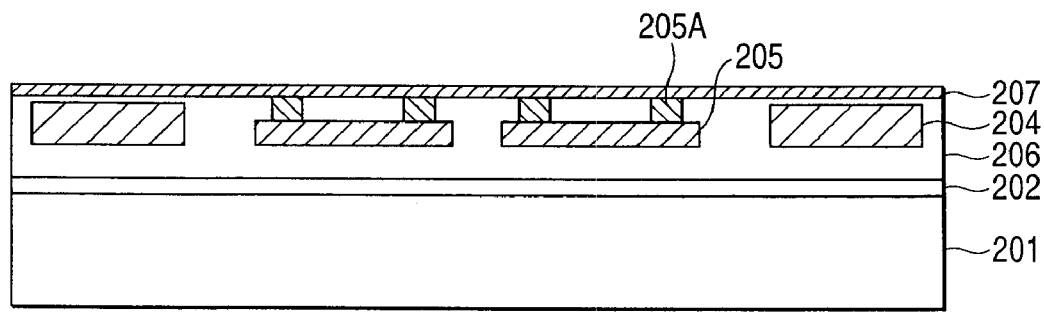
FIG. 5E is a fifth view illustrating a method of manufacturing the wiring board according to a second embodiment.

Subsequently, in a step shown in FIG. 5E, a seed layer 207 is formed on the insulating layer 206 and on the exposed bumps 205A by, for instance, electroless Cu plating.

Figure 5F:
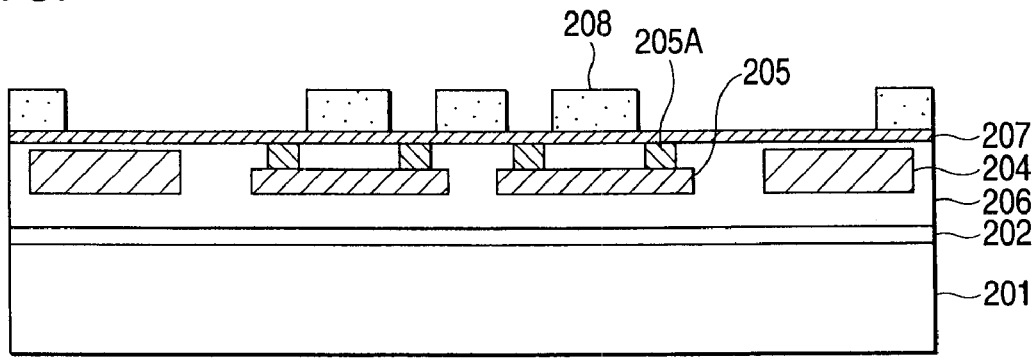
FIG. 5F is a sixth view illustrating a method of manufacturing the wiring board according to a second embodiment.

Subsequently, in a step shown in FIG. 5F, for example, dry film resist (DFR) is laminated on the seed layer 207. Then, patterning is performed thereon by performing a photolithography process. Thus, a resist pattern 208 is formed.

Figure 5G:
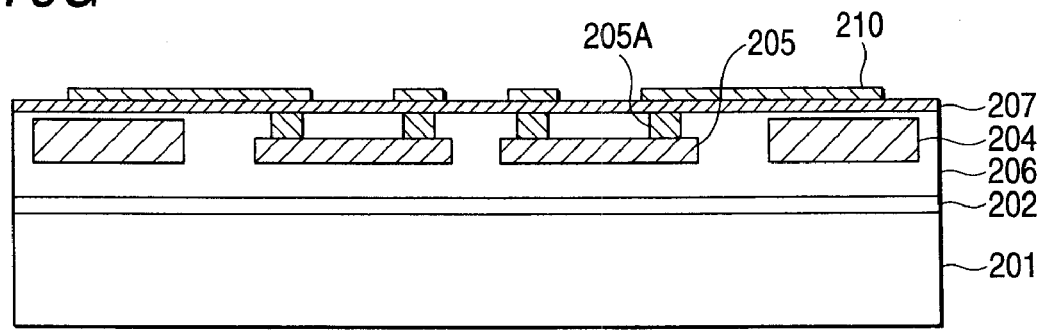
FIG. 5G is a seventh view illustrating a method of manufacturing the wiring board according to a second embodiment.

Subsequently, in a step shown in FIG. 5G, the pattern wiring 210 is formed by, for instance, electrolytic Cu plating so as to bury each opening portion of the resist pattern 208. Upon completion of the electrolytic plating, the resist pattern 208 is peeled off.

Figure 5H:
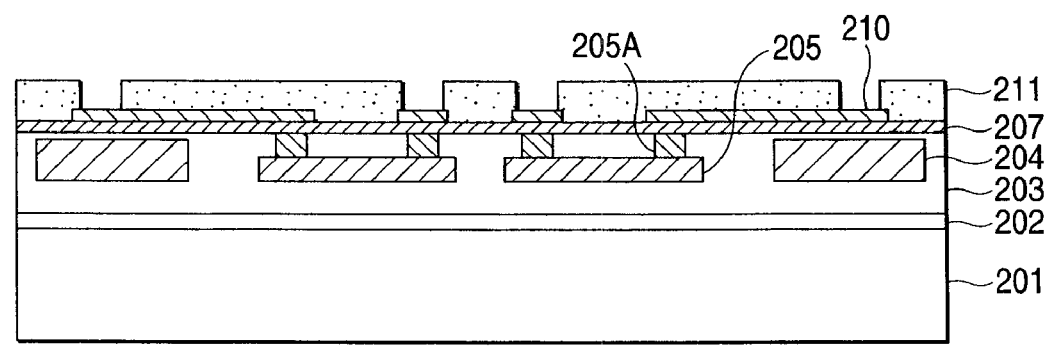
FIG. 5H is an eighth view illustrating a method of manufacturing the wiring board according to a second embodiment.

Subsequently, in a step shown in FIG. 5H, for example, the dry film resist is laminated on the seed layer 207 and on the pattern wiring 210. Then, the patterning is performed thereon by the photolithography method. Thus, a resist pattern 211 is formed.

Figure 5I:
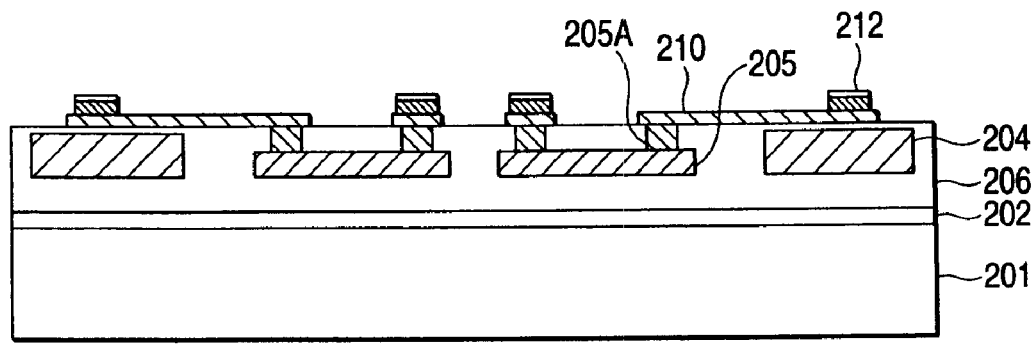
FIG. 5I is a ninth view illustrating a method of manufacturing the wiring board according to a second embodiment.

Subsequently, in a step shown in FIG. 5I, the terminal connection portions 212, each of which includes, for instance, the Ni/Au layer, are formed by, for example, the electrolytic plating on a surface of opening portions of the resist pattern 211 from which the pattern wiring 210 is exposed. Then, the resist pattern 211 is peeled off after the terminal connection portions 212 are formed. Further, unnecessary portions of the seed layer 207 on the insulating layer 206 are removed by etching.

Figure 5J:
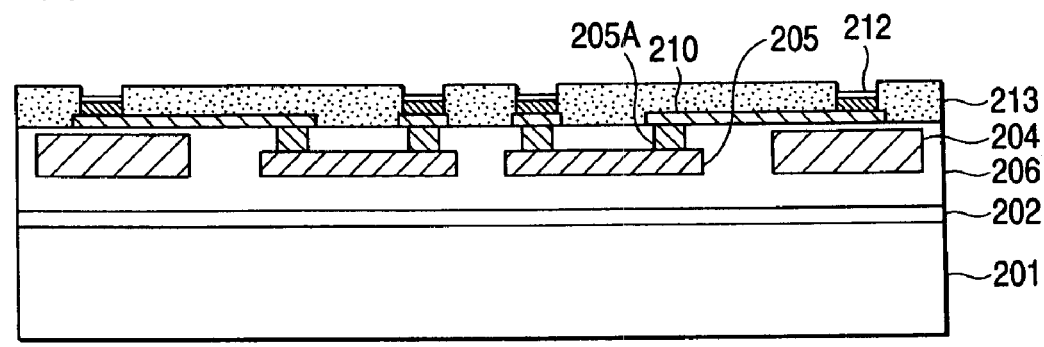
FIG. 5J is a tenth view illustrating a method of manufacturing the wiring board according to a second embodiment.

Subsequently, in a step shown in FIG. 5J, the solder resist layer 213 is formed on the pattern wiring 210 and the insulating layer 206 so as to expose the terminal connection portions 212.

Figure 5K:
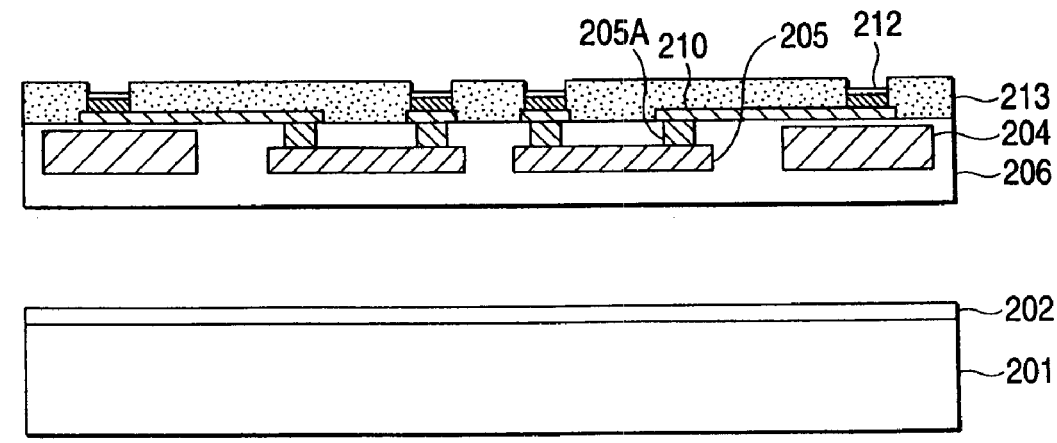
FIG. 5K is an eleventh view illustrating a method of manufacturing the wiring board according to a second embodiment.

Subsequently, in a step shown in FIG. 5K, similarly to the first embodiment, the entire wring board is heated to 180° C. by, for instance, an oven. Thus, the insulating layer 206 is peeled off from the release layer 202, and the supporting board 201 is removed from the insulating layer 206. After this step, solder balls are formed on the terminal connection portions 212, as needed. Thus, the wiring board 200 shown in FIG. 4 can be formed.

According to the manufacturing method according to the second embodiment, a degree of the warpage of the wiring board is more effectively suppressed, as compared with the related method. Consequently, the advantage informing the wiring board, of which degree in flatness is high and which is high in reliability, is obtained similarly to the first embodiment.

Also, the present invention is not limited to the embodiments. Apparently, various modifications and alterations of the configuration and the structure of the wiring of the wiring board may be made. Further, a variety of modification and alterations of the method of connecting the wiring and the semiconductor chip may be made.

While the present invention is described with reference to specific embodiments, various modifications and alterations may be made by those skilled in the art without departing from the spirit and scope of the invention described in the appended claims.

According to the invention, the reduction in the thickness of a wiring board incorporating semiconductor chips is enabled, and the suppression of the warpage of such a wiring board is possible.

What is claimed is:

1. A method of manufacturing a wiring board, said method comprising:
   forming a first insulating layer on a supporting board;
   mounting at least one reinforcing member on the first insulating layer;
   mounting at least one semiconductor chip on the first insulating layer;
   forming a second insulating layer on the reinforcing member and the semiconductor chip; and
   forming a wiring on the second insulating layer, the wiring being connected to the semiconductor chip.

2. The method of manufacturing the wiring board according to claim 1, further comprising:
   peeling the supporting board from the first insulating layer.

3. The method of manufacturing the wiring board according to claim 2, further comprising:

forming a release layer between the supporting board and the first insulating layer, the release layer facilitating peeling of the supporting board from the first insulating layer.

4. The method of manufacturing the wiring board according to claim 1, further comprising:
   curing the first insulating layer and the second insulating layer by heat,
   wherein the first insulating layer and the second insulating layer are made of heat-hardening resin material.

5. The method of manufacturing the wiring board according to claim 1, wherein the reinforcing member and the semiconductor chip are mounted on substantially a same plane.

6. The method of manufacturing the wiring board according to claim 1, wherein the reinforcing member is formed so as to surround the semiconductor chip.

7. The method of manufacturing the wiring board according to claim 1, wherein
   said at least one reinforcing member includes a plurality of reinforcing members, and
   the plurality of reinforcing members is formed on both end portions of the wiring board.

8. The method of manufacturing the wiring board according to claim 1, wherein
   said at least one reinforcing member includes a plurality of reinforcing members, and
   the plurality of reinforcing members is formed in vicinities of corner portions of the wiring board.

9. The method of manufacturing the wiring board according to claim 1, further comprising:
   forming a via hole in the second insulating layer; and
   forming a via plug in the via hole.

10. The method of manufacturing the wiring board according to claim 9, wherein the via plug is formed in the via hole in a same step as forming the wiring on the second insulating layer.

11. The method of manufacturing the wiring board according to claim 9, wherein the via hole is formed by using a laser beam, and a bump formed on the semiconductor chip serves as a stopper layer of the laser beam.

12. The method of manufacturing the wiring board according to claim 1, further comprising:
   grinding the second insulating layer so as to expose a bump formed on the semiconductor chip,
   wherein the wiring is formed on the second insulating layer so as to be connected to the exposed bump.

* * * * *